(12) United States Patent
Ren et al.

(10) Patent No.: US 12,110,607 B2
(45) Date of Patent: Oct. 8, 2024

(54) APPARATUS, METHOD, AND PROCESS FOR DIRECTIONAL SOLIDIFICATION BY LIQUID METAL SPRAYING ENHANCED COOLING (LMSC)

(71) Applicant: Shanghai University, Shanghai (CN)

(72) Inventors: Zhongming Ren, Shanghai (CN); Jiang Wang, Shanghai (CN); Xingfu Ren, Shanghai (CN); Zhenqiang Zhang, Shanghai (CN); Xiaoxin Zhang, Shanghai (CN); Xia Li, Shanghai (CN); Tingsheng Tu, Shanghai (CN); Baojun Wang, Shanghai (CN)

(73) Assignee: Shanghai University, Shanghai (CN)

( * ) Notice: Subject to any disclaimer, the term of this patent is extended or adjusted under 35 U.S.C. 154(b) by 210 days.

(21) Appl. No.: 17/884,092

(22) Filed: Aug. 9, 2022

(65) Prior Publication Data
US 2023/0160092 A1 May 25, 2023

(30) Foreign Application Priority Data

Nov. 19, 2021 (CN) .......................... 202111392208.9

(51) Int. Cl.
*C30B 11/02* (2006.01)
*C30B 11/00* (2006.01)
*C30B 11/14* (2006.01)

(52) U.S. Cl.
CPC .......... *C30B 11/003* (2013.01); *C30B 11/006* (2013.01); *C30B 11/02* (2013.01); *C30B 11/14* (2013.01)

(58) Field of Classification Search
CPC ....... C30B 11/003; C30B 1/006; C30B 11/02; C30B 11/14; C30B 21/00; C30B 21/02; Y10T 117/1092; B22D 27/04; B22D 27/045
See application file for complete search history.

(56) References Cited

U.S. PATENT DOCUMENTS

2002/0124915 A1* 9/2002 Kobayashi .............. C30B 29/52
148/677
2003/0234092 A1* 12/2003 Brinegar .............. B22D 27/045
164/338.1

FOREIGN PATENT DOCUMENTS

CN 101786156 * 7/2010

* cited by examiner

*Primary Examiner* — Robert M Kunemund
(74) *Attorney, Agent, or Firm* — Maine Cernota & Curran

(57) ABSTRACT

The present disclosure relates to the field of directional solidification, and in particular, to an apparatus, method, and process for directional solidification by liquid metal spraying enhanced cooling (LMSC). The process has the following beneficial effects: the apparatus of the present disclosure can regulate a solidification structure of a casting, refine a dendrite spacing, and reduce or avoid metallurgical defects, and can be used to prepare high-quality large-sized columnar/single crystal blades or other castings.

19 Claims, 3 Drawing Sheets

APPARATUS, METHOD, AND PROCESS FOR DIRECTIONAL SOLIDIFICATION BY LIQUID METAL SPRAYING ENHANCED COOLING (LMSC)

RELATED APPLICATION

This patent application claims the benefit and priority of Chinese Patent Application No. 202111392208.9, filed on Nov. 19, 2021, the disclosure of which is incorporated by reference herein in its entirety for all purposes.

TECHNICAL FIELD

The present disclosure relates to the field of directional solidification, and in particular, to an apparatus, method, and process for directional solidification by liquid metal spraying enhanced cooling (LMSC).

BACKGROUND ART

The directional solidification technology is an essential technology for preparing columnar/single crystal blades for aero-engines or gas turbines. During directional solidification, the temperature gradient at the front of a solidification interface is a key factor for the growth quality of the columnar/single crystal blade. A larger temperature gradient is more conducive to the crystal growth. At present, the commonly used directional solidification technologies for preparing columnar/single crystal blades are water-cooled copper plate chilled Bridgman method high-rate solidification (HRS) and liquid metal cooling (LMC) method.

In the HRS method, cooling is mainly performed by heat conduction of the water-cooled copper plate at the bottom of the casting and heat radiation of the casting, and the obtained temperature gradient is limited. In addition, with the progress of solidification, especially for large-sized castings, the effect of heat conduction decreases, and the effect of heat radiation increases, resulting in a decrease and instability in the temperature gradient, which destroys the directional growth of alloy crystals. Therefore, the HRS method is limited in the preparation of large-sized columnar/single crystal castings.

In the LMC method, the drawn castings are immersed in a liquid metal pool with high thermal conductivity, low melting point, high boiling point, and large heat capacity, and the castings are cooled through the heat conduction of the liquid metal, so as to obtain a higher and more stable temperature gradient. However, in the LMC technology, the mold shell immersed in the liquid metal is prone to cracking, and the liquid metal can directly pollute the alloy liquid, or the liquid metal enters the alloy liquid through the gap between the bottom of the mold shell and the bottom of the base due to thermal stress and pollutes the casting. In addition, due to the sharp increase in the temperature of the liquid metal close to the surface of the blade mold shell, the liquid metal temperature gradient in the radiation direction of the mold shell gradually decreases, resulting in a decrease in the cooling effect of the liquid metal. These shortcomings of the LMC method seriously affect the metallurgical quality of the casting and restrict its wide application.

SUMMARY

An objective of the present disclosure is to provide an apparatus, method, and process for directional solidification by LMSC.

On one hand, an apparatus for directional solidification by LMSC of the present disclosure includes a vacuum pump, a main furnace body, and a submerged liquid metal pump. The main furnace body is communicated with the submerged liquid metal pump through a liquid metal transportation tubing. The liquid metal transportation tubing includes an upper liquid metal transportation tubing and a lower liquid metal transportation tubing. The main furnace body is connected to the vacuum pump. An induction melting coil, a mold shell heating and insulation cavity, a liquid metal sprayer, a water-cooled copper plate crystallizer, a liquid metal collector, and an internal melting metal furnace are arranged in the main furnace body from top to bottom in a vertical direction. The upper liquid metal transportation tubing includes one end communicated with the liquid metal sprayer and the other end communicated with the submerged liquid metal pump. The lower liquid metal transportation tubing includes one end communicated with the internal melting metal furnace and the other end communicated with the submerged liquid metal pump. The water-cooled copper plate crystallizer and the liquid metal collector are capable of being moved in the vertical direction in the main furnace body through a seeding system.

Preferably, the seeding system includes a servo motor.

Preferably, the LMSC directional solidification apparatus may further include an external melting metal furnace. The external melting metal furnace may be located outside the main furnace body. The submerged liquid metal pump may be arranged on the external melting metal furnace. Preferably, the submerged liquid metal pump may include a pump body. The pump body may be placed in the external melting metal furnace. Both the upper liquid metal transportation tubing and the lower liquid metal transportation tubing may be communicated with the external melting metal furnace. The submerged liquid metal pump may be vacuum sealed with the external melting metal furnace.

Preferably, the submerged liquid metal pump may be a mechanical liquid metal pump or a magnetic liquid metal pump.

Preferably, the external melting metal furnace and the internal melting metal furnace may be heated by resistance heating rods, and the liquid metal transportation tubing may be heated by a flexible heating band.

Preferably, a master alloy may be placed in the induction melting coil. The master alloy may be heated by an intermediate frequency induction heating power supply. A mold shell placed on the water-cooled copper plate crystallizer is capable of being lifted into the mold shell heating and insulation cavity in the vertical direction. The mold shell heating and insulation cavity may be heated by a graphite heater.

Preferably, the mold shell heating and insulation cavity may be divided into a first heating zone and a second heating zone, and the first heating zone and the second heating zone are capable of independently controlling temperature rise.

Preferably, the liquid metal sprayer may be annular, and the liquid metal sprayer may be provided with spray holes.

Preferably, the seeding system may include a support. Both the water-cooled copper plate crystallizer and the liquid metal collector may be fixed on the support. The water-cooled copper plate crystallizer and the liquid metal collector are capable of being lifted or lowered simultaneously through the seeding system.

Preferably, both sides of the support may be provided with a screw rod.

Preferably, an annular baffle may be arranged around the liquid metal collector.

Preferably, the main furnace body, the external melting metal furnace, and the liquid metal transportation tubing may be connected in a high-temperature resistant manner, and the main furnace body, the external melting metal furnace, and the liquid metal transportation tubing may be vacuumed or filled with an inert gas.

Preferably, the vacuum pump may include a mechanical pump, a Roots pump, and a diffusion pump.

On the other hand, a method for directional solidification by LMSC of the present disclosure uses the above apparatus, and includes the following steps: placing the master alloy in the induction melting coil, placing the mold shell on the water-cooled copper plate crystallizer, casting alloy liquid formed by the master alloy into the mold shell after a temperature and an atmosphere in the apparatus are satisfied, enabling the mold shell to pass through the liquid metal sprayer slowly downward in the vertical direction through the seeding system, transporting, by the submerged liquid metal pump, liquid metal into the liquid metal sprayer through the upper liquid metal transportation tubing when the mold shell is about to pass through the liquid metal sprayer, and spraying, by the liquid metal sprayer, the liquid metal on an outer surface of the mold shell when the mold shell passes through the liquid metal sprayer, so as to enhance cooling of the mold shell, and obtain a large temperature gradient at a solidification interface.

The apparatus and method of the present disclosure can regulate a solidification structure of a casting, refine a dendrite spacing, and reduce or avoid metallurgical defects, and can be used to prepare high-quality large-sized columnar/single crystal blades or other castings. In addition, the liquid metal can be sprayed, collected, and recycled after spraying, and the problems of casting pollution existing in the LMC method and the reduction of the liquid metal temperature gradient in the radiation direction of the mold shell can be avoided.

On the other hand, a process for directional solidification by LMSC of the present disclosure uses the above apparatus and the above method, and includes the following specific steps:

S1: placing the master alloy in the induction melting coil, placing the mold shell on the water-cooled copper plate crystallizer, and lifting the water-cooled copper plate crystallizer and the liquid metal collector in the vertical direction through the seeding system, such that the mold shell is lifted into the mold shell heating and insulation cavity after passing through the liquid metal sprayer;

S2: vacuumizing the main furnace body, and backfilling the main furnace body with an inert atmosphere to a predetermined pressure, where preferably, the inert atmosphere is argon;

S3: heating the external melting metal furnace, the internal melting metal furnace, and the liquid metal transportation tubing to a predetermined temperature, such that the liquid metal for cooling is melted and reaches a predetermined temperature;

S4: smelting the master alloy, and heating the mold shell heating and insulation cavity to a predetermined temperature;

S5: stop heating the internal melting metal furnace, and vacuumizing the main furnace body to a predetermined degree of vacuum;

S6: casting the molten master alloy into the mold shell; and

S7: enabling the mold shell to pass through the liquid metal sprayer slowly downward in the vertical direction through the seeding system, and spraying, by the liquid metal sprayer, the liquid metal on an outer surface of the mold shell when the mold shell passes through the liquid metal sprayer, so as to cool the mold shell.

Preferably, the method may further include the following steps after S7:

S8: enabling the liquid metal falling during spraying to fall and be collected into the liquid metal collector, and flow into the internal melting metal furnace through the liquid metal collector; and S9: transporting the liquid metal in the internal melting metal furnace to the external melting metal furnace through the lower liquid metal transportation tubing.

Preferably, the liquid metal may be a metal with a low melting point and a high boiling point, and preferably, the liquid metal may be tin, aluminum, and alloys thereof.

Preferably, in S2, before being backfilled with the argon, the main furnace body may have a degree of vacuum not greater than 1 Pa.

Preferably, in S3, the liquid metal for spraying may have a temperature 50° C. to 200° C. higher than a melting point.

Preferably, in S4, the predetermined temperature of the mold shell heating and insulation cavity may not be less than 1,500° C.

Preferably, in S5, the predetermined degree of vacuum may not be greater than 10 Pa.

Preferably, in S7, a seeding speed may be adjusted between 1.5 mm/min and 20 mm/min, and preferably, the seeding speed may be a constant speed or a variable speed.

Preferably, in S7, the liquid metal may be sprayed at a spray flow rate adjusted between 20 L/min and 100 L/min.

The present disclosure can effectively regulate a solidification structure of a casting, refine a dendrite spacing, and reduce or avoid metallurgical defects by, for example, adjusting the temperature of the liquid metal, the flow rate and the drawing rate of the casting, and is suitable for preparing high-quality large-sized columnar/single crystal blades or other large-sized complex castings.

One general aspect of the present invention is an apparatus for directional solidification by liquid metal spraying enhanced cooling (LMSC). The apparatus includes a vacuum pump, a main furnace body, a submerged liquid metal pump, an induction melting coil, a mold shell heating and insulation cavity, a liquid metal sprayer, a water-cooled copper plate crystallizer, and a liquid metal collector and an internal melting metal furnace arranged in the main furnace body from top to bottom in a vertical direction. The main furnace body is communicated with the submerged liquid metal pump through a liquid metal transportation tubing, the liquid metal transportation tubing comprises an upper liquid metal transportation tubing and a lower liquid metal transportation tubing, the main furnace body is connected to the vacuum pump, the upper liquid metal transportation tubing comprises one end communicated with the liquid metal sprayer and the other end communicated with the submerged liquid metal pump, the lower liquid metal transportation tubing comprises one end communicated with the internal melting metal furnace and the other end communicated with the submerged liquid metal pump, the water-cooled copper plate crystallizer and the liquid metal collector are capable of being moved in the vertical direction in the main furnace body through a seeding system, and the seeding system comprises a servo motor.

Embodiments further include an external melting metal furnace, wherein the external melting metal furnace is located outside the main furnace body, the submerged liquid metal pump is arranged on the external melting metal furnace, the submerged liquid metal pump comprises a pump body, the pump body is placed in the external melting metal furnace, both the upper liquid metal transportation tubing and the lower liquid metal transportation tubing are communicated with the external melting metal furnace, the submerged liquid metal pump is vacuum sealed with the external melting metal furnace, and the submerged liquid metal pump is a mechanical liquid metal pump or a magnetic liquid metal pump. In some of these embodiments, the external melting metal furnace and the internal melting metal furnace are heated by resistance heating rods, and the liquid metal transportation tubing is heated by a flexible heating band. In other of these embodiments, the main furnace body, the external melting metal furnace, and the liquid metal transportation tubing are connected in a high-temperature resistant manner, and the main furnace body, the external melting metal furnace, and the liquid metal transportation tubing are vacuumed or filled with an inert gas.

In embodiments, the internal melting metal furnace is heated by a resistance heating rod, and the liquid metal transportation tubing is heated by a flexible heating band.

In various embodiments, including some embodiments that include the external melting metal furnace, a master alloy is placed in the induction melting coil, the master alloy is heated by an intermediate frequency induction heating power supply, a mold shell placed on the water-cooled copper plate crystallizer is capable of being lifted into the mold shell heating and insulation cavity in the vertical direction, and the mold shell heating and insulation cavity is heated by a graphite heater. In some of these embodiments, the mold shell heating and insulation cavity is divided into a first heating zone and a second heating zone, and the first heating zone and the second heating zone are capable of independently controlling temperature rise.

In various embodiments, including some embodiments that include the external melting metal furnace, the liquid metal sprayer is annular, and the liquid metal sprayer is provided with spray holes.

In various embodiments, including some embodiments that include the external melting metal furnace, the seeding system comprises a support, both the water-cooled copper plate crystallizer and the liquid metal collector are fixed on the support, the water-cooled copper plate crystallizer and the liquid metal collector are capable of being lifted or lowered simultaneously through the seeding system, and both sides of the support are provided with a screw rod.

In various embodiments, including some embodiments that include the external melting metal furnace, an annular baffle is arranged around the liquid metal collector.

And in various embodiments, including some embodiments that include the external melting metal furnace, the vacuum pump comprises a mechanical pump, a Roots pump, and a diffusion pump.

A second general aspect of the present invention is a method of directional solidification by LMSC. The method includes providing an apparatus according to the first general aspect, placing the master alloy in the induction melting coil, placing the mold shell on the water-cooled copper plate crystallizer, casting alloy liquid formed by the master alloy into the mold shell after a temperature and an atmosphere in the apparatus are satisfied, enabling the mold shell to pass through the liquid metal sprayer slowly downward in the vertical direction through the seeding system, transporting, by the submerged liquid metal pump, liquid metal into the liquid metal sprayer through the upper liquid metal transportation tubing when the mold shell is about to pass through the liquid metal sprayer, and spraying, by the liquid metal sprayer, the liquid metal on an outer surface of the mold shell when the mold shell passes through the liquid metal sprayer, so as to enhance cooling of the mold shell, and obtain a large temperature gradient at a solidification interface.

A third general aspect of the present invention is a process for directional solidification by LMSC. The process includes the steps of:
  S0: providing an apparatus according to claim 1;
  S1: placing the master alloy in the induction melting coil, placing the mold shell on the water-cooled copper plate crystallizer, and lifting the water-cooled copper plate crystallizer and the liquid metal collector in the vertical direction through the seeding system, such that the mold shell is lifted into the mold shell heating and insulation cavity after passing through the liquid metal sprayer;
  S2: vacuumizing the main furnace body, and backfilling the main furnace body with an inert atmosphere to a predetermined pressure, wherein the inert atmosphere is argon;
  S3: heating the external melting metal furnace, the internal melting metal furnace, and the liquid metal transportation tubing to a predetermined temperature, such that the liquid metal for cooling is melted and reaches a predetermined temperature;
  S4: smelting the master alloy, and heating the mold shell heating and insulation cavity to a predetermined temperature;
  S5: stop heating the internal melting metal furnace, and vacuumizing the main furnace body to a predetermined degree of vacuum;
  S6: casting the molten master alloy into the mold shell; and
  S7: enabling the mold shell to pass through the liquid metal sprayer slowly downward in the vertical direction through the seeding system, and spraying, by the liquid metal sprayer, the liquid metal on an outer surface of the mold shell when the mold shell passes through the liquid metal sprayer, so as to cool the mold shell.

Embodiments further include,
  S8: enabling the liquid metal falling during spraying to fall and be collected into the liquid metal collector, and flow into the internal melting metal furnace through the liquid metal collector; and
  S9: transporting the liquid metal in the internal melting metal furnace to the external melting metal furnace through the lower liquid metal transportation tubing.

In embodiments, the liquid metal is a metal with a low melting point and a high boiling point, and the liquid metal is tin, aluminum, and alloys thereof.

In some embodiments, in S2, before being backfilled with the argon, the main furnace body has a degree of vacuum not greater than 1 Pa.

In certain embodiments, in S3, the liquid metal for spraying has a temperature 50° C. to 200° C. higher than its melting point.

In some embodiments, in S4, the predetermined temperature of the mold shell heating and insulation cavity is not less than 1,500° C.

In embodiments, in S5, the predetermined degree of vacuum is not greater than 10 Pa.

And in various embodiments, in S7, a seeding speed is adjusted between 1.5 mm/min and 20 mm/min, and the seeding speed is a constant speed or a variable speed.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

Figure 1:
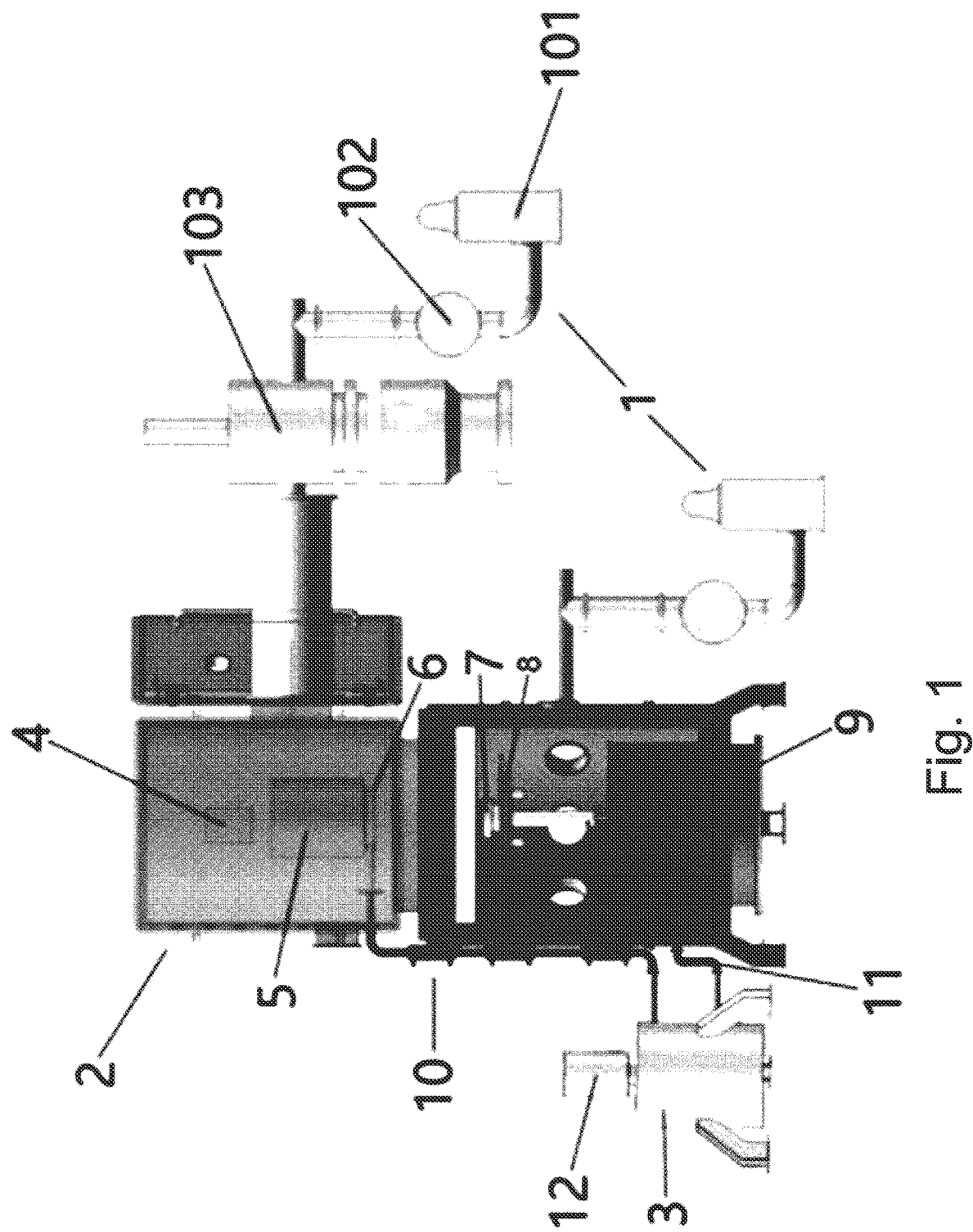
FIG. 1 is a schematic diagram of an overall structure of an embodiment of the present disclosure.

REFERENCE NUMERALS 1, vacuum pump
101, mechanical pump
102 Roots pump
103, diffusion pump
2, main furnace body
3, external melting metal furnace
4, induction melting coil
5, mold shell heating and insulation cavity
6, liquid metal sprayer
7, water-cooled copper plate crystallizer
8, liquid metal collector
9, internal melting metal furnace
10, upper liquid metal transportation tubing
11, lower liquid metal transportation tubing
12, submerged liquid metal pump.

DETAILED DESCRIPTION OF THE EMBODIMENTS

The embodiments of the present disclosure are described in detail below with reference to the accompanying drawings. It should be understood that the embodiments described herein are merely intended to illustrate and interpret the present disclosure, rather than to limit the present disclosure.

In the present disclosure, in the absence of any description to the contrary, orientation terms used, such as "upper, lower, inner, and outer", are usually used to indicate the upper, lower, inner, and outer as shown in the accompanying drawings.

With reference to FIG. 1, an embodiment of the present disclosure includes: a vacuum pump 1 (a three-stage vacuum pump can be used), a main furnace body 2, an external melting metal furnace 3, an induction melting coil 4, a mold shell heating and insulation cavity 5, a liquid metal sprayer 6, a water-cooled copper plate crystallizer 7, a liquid metal collector 8, an internal melting metal furnace 9, an upper liquid metal transportation tubing 10, a lower liquid metal transportation tubing 11, and a submerged liquid metal pump 12.

The vacuum pump 1 may be composed of three-stage pumps: a mechanical pump 101, a Roots pump 102, and a diffusion pump 103. The vacuum pump 1 is connected to the main furnace body 2 through a valve. The main furnace body 2 and the external melting metal furnace 3 are connected through the upper liquid metal transportation tubing 10 and the lower liquid metal transportation tubing 11 to form vacuum chambers that are connected to each other. A degree of vacuum of the apparatus in a cold state can reach $2.2 \times 10^{-3}$ Pa, and a pressure rise rate is about 3 Pa/h. The induction melting coil 4 adopts an intermediate frequency induction heating power supply with a power of 100 kW, which is used for smelting superalloys.

The mold shell heating and insulation cavity 5 is heated by graphite resistance, can be divided into upper and lower zones for independent control, and has a design temperature greater than or equal to 1,500° C. and an effective inner cavity size of $\Phi 450 \times h650$ mm.

The liquid metal sprayer 6 is in a ring-shaped structure, fixed below the mold shell heating and insulation cavity 5, and connected to the upper liquid metal transportation tubing 10. When the mold shell is pulled down from the mold shell heating and insulation cavity 5 and passes through the liquid metal sprayer 6, the liquid metal can be sprayed uniformly to the surface of the mold shell from spray holes around the liquid metal sprayer 6.

The water-cooled copper plate crystallizer 7 has a diameter of $\Phi 300$ mm, and is controlled to be lifted or lowered by screw drive, and a moving speed is adjusted in a range of 1.5 mm/min-200 mm/min. The liquid metal collector 8 is located on the support together with the water-cooled copper plate crystallizer 7, and can move synchronously with the water-cooled copper plate crystallizer 7.

The internal melting metal furnace 9 is located below the liquid metal collector 8, can have a size of $1.2 \times 0.8 \times 0.6$ m, with an upper part open, and is heated by a resistance heater. The internal melting metal furnace 9 is connected to the external melting metal furnace 3 through the lower liquid metal transportation tubing 11.

The upper liquid metal transportation tubing and the lower liquid metal transportation tubing are tubes with an inner diameter of $\Phi 50$ mm, and the outside is wound with a flexible heating band, and then wrapped with thermal insulation cotton. The temperature of the tubing can be adjusted, and the main furnace body 2 and the external melting metal furnace 3 are connected in a high-temperature resistant and vacuum manner, which can not only ensure that the liquid metal will not solidify and block in the tubing, but also ensure the degree of vacuum of the chamber.

The external melting metal furnace 3 has a size of $\Phi 800 \times h600$ mm, and is internally provided with a resistance heater, such that it can be heated from the inside to obtain higher heating efficiency. The outer periphery, bottom and upper part of the external melting metal furnace 3 are all wrapped with thermal insulation cotton to reduce heat loss.

The submerged liquid metal pump 12 can be used to provide the power for liquid metal spraying, and is installed at the upper part of the external melting metal furnace 3, and the two are connected by vacuum sealing, so as to ensure the sealing of the whole system. The submerged liquid metal pump 12 has the characteristics of great high temperature resistance, and excellent vacuum sealing and corrosion resistance. The submerged liquid metal pump includes a pump bearing, which is specially heat-treated and adopts a vacuum dynamic seal design. The pump head is designed to be 5 m, and the maximum flow rate is 5 $m^3$/h.

The process of liquid metal spraying is that the submerged liquid metal pump 12 transports the liquid metal from the external melting metal furnace 3 to the liquid metal sprayer 6 through the upper transportation tubing 10. The liquid metal can pass through the liquid metal sprayer 6. During the pull-down of the casting, the casting is pulled down constantly and evenly sprayed with the liquid metal to enhance cooling. The sprayed liquid metal will fall to the liquid metal collector 8 due to the action of gravity, and then flows into the internal melting metal furnace 9 through the liquid metal collector 8. Finally, the liquid metal flows back to the external melting metal furnace 3 through the lower liquid metal transportation tubing 11, thereby forming a circulating liquid metal spraying system.

All the above functional controls, including vacuum, smelting heating, seeding, liquid metal spraying and temperature measurement control, can be integrated into the same display and control system user terminal for operation.

In an embodiment of the process of the present disclosure, a nickel-based superalloy can be used as the raw material. Tin is selected as the liquid metal for spraying, the single crystal is prepared by the crystal selection method, and an improved mold shell with strong thermal shock resistance is used as the mold shell of the present embodiment.

Figure 2A:
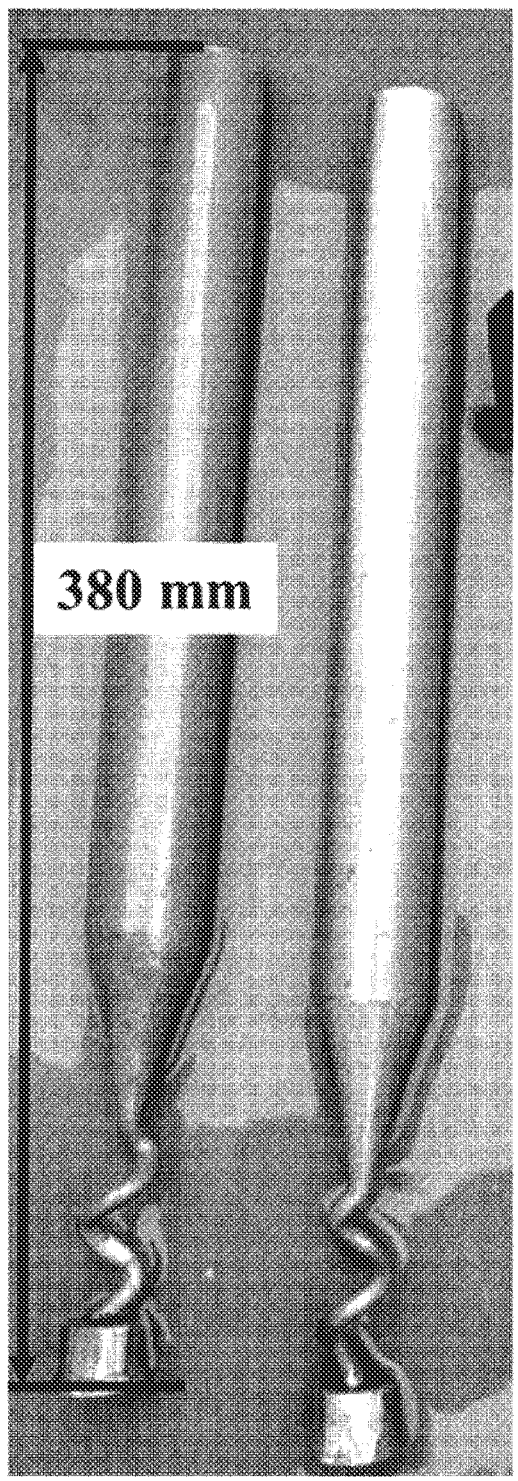
FIG. 2a is a physical diagram of a single crystal test bar prepared by an embodiment of the present disclosure.
Figure 2B:
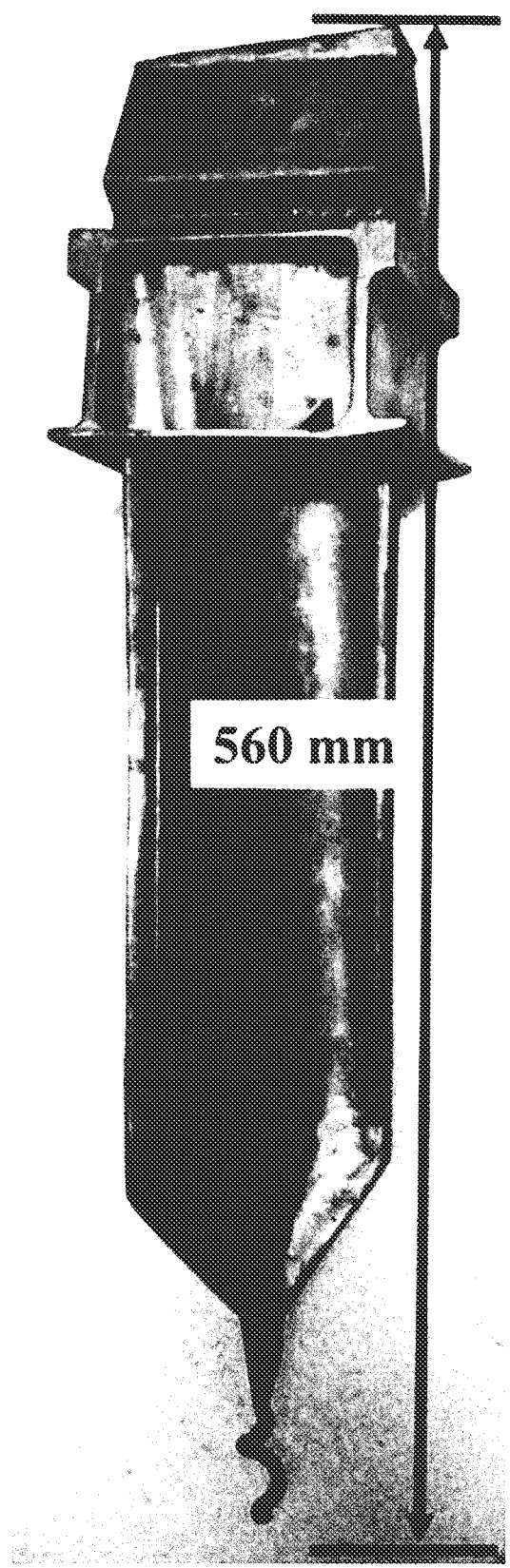
FIG. 2b is a physical diagram of a solid large-sized single crystal blade prepared by an embodiment of the present disclosure.

With reference to FIG. 1, FIG. 2*a*, and FIG. 2*b* again, the specific steps are as follows.

S1: The mold shell is placed on the water-cooled copper plate crystallizer 7, and the water-cooled copper plate crystallizer 7 is lifted into the mold shell heating and insulation cavity 5. The nickel-based superalloy (namely the master alloy) is placed in the crucible in the induction melting coil 4.

S2: The vacuum pump 1 is turned on. The main furnace body 2 is vacuumized until the degree of vacuum is less than or equal to 1 Pa, and backfilled with argon to 0.8 atm.

S3: The internal melting metal furnace 9, the external melting metal furnace 3, the upper liquid metal transportation tubing 10, and the lower liquid metal transportation tubing 11 are heated, and the temperature is set to 350° C.

S4: The mold shell heating and insulation cavity 5 heats up according to a certain heating curve, such that the temperatures of the two independent upper and lower heating zones reach 1,510° C. and 1,530° C. respectively.

S5: The high-temperature master alloy is smelted, such that the temperature of the master alloy melt reaches 1,530° C.

S6: The heating power supply of the internal melting metal furnace 9 is turned off.

S7: The vacuum pump 1 is turned on. The main furnace body 2 is vacuumized until the degree of vacuum is less than or equal to 1 Pa again, and the vacuum pump 1 is kept running.

S8: The smelting power is adjusted to maintain the temperature of the master alloy melt at 1,530° C., and casting is performed.

S9: A seeding speed curve is set. The seeding is enabled to make the water-cooled copper plate crystallizer 7 be pulled down 80 mm at a speed of 2 mm/min, so as to complete the seeding.

S10: The pull-down speed can be automatically adjusted to 6 mm/min, and the submerged liquid metal pump 12 is started. The liquid metal spraying is enabled, and the flow rate is set to 47 L/min.

S11: After the seeding is completed, the submerged liquid metal pump 12 is turned off, all heating power supplies are turned off, and the vacuum pump 1 is turned off.

The single crystal test bar (Φ25 mm) and large-sized single crystal blade preliminarily obtained by the above process are shown in FIG. 2*a* and FIG. 2*b*. It can be seen from the figures that a complete single crystal test bar and a large-sized single crystal blade can be obtained by using the process of the present disclosure.

It should be noted that the apparatuses described in the present disclosure can be controlled by a computer through an integrated control system, and can be controlled by operating a computer interface during operation.

To sum up, the apparatus for directional solidification by LMSC of the present disclosure includes the vacuum pump 1, the main furnace body 2, and the submerged liquid metal pump 12. Preferably, the vacuum pump 1 is a three-stage pump including the mechanical pump 101, the Roots pump 102, and the diffusion pump 103. There is a vacuum environment between the three-stage pumps, otherwise, the liquid metal and the master alloy liquid will be seriously oxidized, and the graphite heater of the mold shell heating and insulation cavity 5 is easy to burn out. The main furnace body 2 is communicated with the submerged liquid metal pump 12 through a liquid metal transportation tubing. The liquid metal transportation tubing includes an upper liquid metal transportation tubing 10 and a lower liquid metal transportation tubing 11. The main furnace body 2 is connected to the vacuum pump 1. The induction melting coil 4, the mold shell heating and insulation cavity 5, the liquid metal sprayer 6, the water-cooled copper plate crystallizer 7, the liquid metal collector 8, and the internal melting metal furnace 9 are arranged in the main furnace body 2 from top to bottom in a vertical direction. The upper liquid metal transportation tubing 10 includes one end communicated with the liquid metal sprayer 6 and the other end communicated with the submerged liquid metal pump 12. The lower liquid metal transportation tubing 11 includes one end communicated with the internal melting metal furnace 9 and the other end communicated with the submerged liquid metal pump 12. The water-cooled copper plate crystallizer 7 and the liquid metal collector 8 are capable of being moved in the vertical direction in the main furnace body 2 through a seeding system. Preferably, the seeding system includes a servo motor. Further, the submerged liquid metal pump 12 can be installed outside the main furnace body 2, or can be placed in the main furnace body 2. When the submerged liquid metal pump is placed in the main furnace body 2, circulating spraying is performed on the liquid metal in the main furnace body 2.

Preferably, when the submerged liquid metal pump 12 is installed outside the main furnace body 2, the apparatus may further include the external melting metal furnace 3. The external melting metal furnace 3 is located outside the main furnace body 2. The submerged liquid metal pump 12 is arranged on the external melting metal furnace 3. Preferably, the submerged liquid metal pump 12 includes a motor, a pump bearing, and a pump body. The pump body is placed in the external melting metal furnace 3 (that is, immersed in the liquid metal), and can be connected by a flange. Both the upper liquid metal transportation tubing 10 and the lower liquid metal transportation tubing 11 are communicated with the external melting metal furnace 3. The submerged liquid metal pump 12 is vacuum sealed with the external melting metal furnace 3.

Preferably, the submerged liquid metal pump 12 is a mechanical liquid metal pump or a magnetic liquid metal pump. The submerged liquid metal pump 12 can provide the power for liquid metal spraying, and the flow rate of the liquid metal can be adjusted.

Preferably, the external melting metal furnace 3 and the internal melting metal furnace 9 can be heated by resistance heating rods (for the case where the liquid metal circulates in the main furnace body 2, only the internal melting metal furnace 9 is heated), and the liquid metal transportation tubing can be heated by a flexible heating band. Through the above arrangement, the temperature of the liquid metal for spraying can be adjusted by the heaters of the internal melting metal furnace and the external melting metal furnace (for the case where the liquid metal circulates in the main furnace body 2, only the internal melting metal furnace 9 needs to be adjusted).

Further, the master alloy is placed in the induction melting coil 4. The master alloy can be heated by an intermediate frequency induction heating power supply. The mold shell placed on the water-cooled copper plate crystallizer 7 is capable of being lifted into the mold shell heating and insulation cavity 5 in the vertical direction. The mold shell heating and insulation cavity 5 can be heated by a graphite heater.

Preferably, the mold shell heating and insulation cavity 5 is divided into a first heating zone and a second heating zone, and the first heating zone and the second heating zone are capable of independently controlling temperature rise.

Preferably, the liquid metal sprayer 6 is annular, and the liquid metal sprayer 6 is provided with spray holes.

In addition, the seeding system includes a support. Both the water-cooled copper plate crystallizer 7 and the liquid metal collector 8 are fixed on the support. The water-cooled copper plate crystallizer 7 and the liquid metal collector 8 are capable of being lifted or lowered simultaneously through the seeding system. Preferably, both sides of the support are provided with a screw rod. The support moves up and down through the screw rods on the left and right sides, and the screw rods are driven by the servo motor.

In order to prevent the liquid metal from splashing when falling during spraying, an annular baffle is arranged around the liquid metal collector 8, and through the annular baffle, the liquid metal during spraying can all fall into the liquid metal collector 8.

Preferably, the main furnace body 2, the external melting metal furnace 3, and the liquid metal transportation tubing are connected in a high-temperature resistant manner, and the main furnace body 2, the external melting metal furnace 3, and the liquid metal transportation tubing are vacuumed or filled with an inert gas.

A method for directional solidification by LMSC of the present disclosure uses the above apparatus. Specifically, the master alloy is placed in the induction melting coil 4. The mold shell is placed on the water-cooled copper plate crystallizer 7. Alloy liquid formed by the master alloy is cast into the mold shell after a temperature and an atmosphere in the apparatus are satisfied. The mold shell passes through the liquid metal sprayer 6 slowly downward in the vertical direction through the seeding system. The submerged liquid metal pump 12 transports liquid metal into the liquid metal sprayer 6 through the upper liquid metal transportation tubing 10 when the mold shell is about to pass through the liquid metal sprayer 6. The liquid metal sprayer 6 sprays the liquid metal on an outer surface of the mold shell when the mold shell passes through the liquid metal sprayer 6, so as to enhance cooling of the mold shell, and obtain a large temperature gradient at a solidification interface.

A process for directional solidification by LMSC of the present disclosure includes the following specific steps.

S1: The master alloy is placed in the induction melting coil 4. The mold shell is placed on the water-cooled copper plate crystallizer 7. The water-cooled copper plate crystallizer 7 and the liquid metal collector 8 are lifted in the vertical direction through the seeding system, such that the mold shell is lifted into the mold shell heating and insulation cavity 5 after passing through the liquid metal sprayer 6.

S2: The main furnace body 2 is vacuumized, and backfilled with an inert atmosphere to a predetermined pressure. Preferably, the inert atmosphere is argon.

S3: The external melting metal furnace 3, the internal melting metal furnace 9, and the liquid metal transportation tubing are heated to a predetermined temperature, such that the liquid metal for cooling is melted and reaches a predetermined temperature.

S4: The master alloy is smelted, and the mold shell heating and insulation cavity 5 is heated to a predetermined temperature.

S5: The internal melting metal furnace 9 is stopped heating, and the main furnace body is vacuumized to a predetermined degree of vacuum.

S6: The molten master alloy is cast into the mold shell.

S7: The mold shell passes through the liquid metal sprayer 6 slowly downward in the vertical direction through the seeding system. The liquid metal sprayer 6 sprays the liquid metal on an outer surface of the mold shell when the mold shell passes through the liquid metal sprayer 6, so as to cool the mold shell.

Further, the method may further include the following steps after S7.

S8: The liquid metal falling during spraying falls and is collected into the liquid metal collector 8, and flows into the internal melting metal furnace 9 through the liquid metal collector 8.

S9: The liquid metal in the internal melting metal furnace 9 is transported to the external melting metal furnace 3 through the lower liquid metal transportation tubing 11, thereby realizing the circulating spraying of liquid metal under vacuum.

Preferably, the liquid metal is a metal with a low melting point and a high boiling point, and preferably, the liquid metal is tin, aluminum, and alloys thereof.

Preferably, in S2, before being backfilled with the argon, the main furnace body has a degree of vacuum not greater than 1 Pa.

Preferably, in S3, the liquid metal for spraying has a temperature 50° C. to 200° C. higher than a melting point (due to the different melting points of different metals, as known to those skilled in the art, the tin has a melting point of 230° C.).

In addition, in S4, the predetermined temperature of the mold shell heating and insulation cavity 5 is not less than 1,500° C.

Preferably, in S5, the predetermined degree of vacuum is not greater than 10 Pa.

Preferably, in S7, a seeding speed is adjusted between 1.5 mm/min and 20 mm/min (that is, the mold shell can slowly pass through the liquid metal sprayer 6 at a speed of 1.5 mm/min to 20 mm/min), and preferably, the seeding speed is a constant speed or a variable speed.

Preferably, in S7, the liquid metal is sprayed at a spray flow rate adjusted between 20 L/min and 100 L/min.

The present disclosure provides the novel LMSC directional solidification apparatus, method, and process. The apparatus, method, and process can not only obtain a higher temperature gradient at the solidification interface than the mainstream HRS method, but also overcome the problems of casting pollution and gradual reduction of temperature gradient in the existing LMC method. The present disclosure can be applied to both large-scale industrial-grade equipment and small-scale experimental-grade equipment. The present disclosure can effectively regulate a solidification structure of a casting, refine a dendrite spacing, and reduce or avoid metallurgical defects, and is suitable for preparing high-quality large-sized columnar/single crystal blades or other large-sized complex castings.

The preferred embodiments of the present disclosure are described in detail above with reference to the accompanying drawings, but the present disclosure is not limited thereto. Within the scope of the technical concept of the present disclosure, a variety of simple modifications can be made to the technical solutions of the present disclosure, including the combination of specific technical features in any suitable manner. In order to avoid unnecessary repetition, the present disclosure will not describe various possible combinations. However, these simple modifications and combinations should also be regarded as the contents disclosed in the present disclosure, which all belong to the protection scope of the present disclosure.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. An apparatus for directional solidification by liquid metal spraying enhanced cooling (LMSC), comprising:
    a vacuum pump;
    a main furnace body;
    a submerged liquid metal pump;
    an induction melting coil;
    a mold shell heating and insulation cavity;
    a liquid metal sprayer;
    a water-cooled copper plate crystallizer;
    a liquid metal collector and an internal melting metal furnace arranged in the main furnace body from top to bottom in a vertical direction; and
    an external melting metal furnace;
    wherein:
        the main furnace body is communicated with the submerged liquid metal pump through a liquid metal transportation tubing;
        the liquid metal transportation tubing comprises an upper liquid metal transportation tubing and a lower liquid metal transportation tubing;
        the main furnace body is connected to the vacuum pump;
        the upper liquid metal transportation tubing comprises one end communicated with the liquid metal sprayer and the other end communicated with the submerged liquid metal pump;
        the lower liquid metal transportation tubing comprises one end communicated with the internal melting metal furnace and the other end communicated with the submerged liquid metal pump;
        the water-cooled copper plate crystallizer and the liquid metal collector are capable of being moved in the vertical direction in the main furnace body through a seeding system;
        the seeding system comprises a servo motor;
        the external melting metal furnace is located outside the main furnace body;
        the submerged liquid metal pump is arranged on the external melting metal furnace;
        the submerged liquid metal pump comprises a pump body;
        the pump body is placed in the external melting metal furnace;
        both the upper liquid metal transportation tubing and the lower liquid metal transportation tubing are communicated with the external melting metal furnace;
        the submerged liquid metal pump is vacuum sealed with the external melting metal furnace; and
        the submerged liquid metal pump is a mechanical liquid metal pump or a magnetic liquid metal pump.

2. The apparatus of claim 1, wherein the external melting metal furnace and the internal melting metal furnace are heated by resistance heating rods, and the liquid metal transportation tubing is heated by a flexible heating band.

3. The apparatus of claim 1, wherein the main furnace body, the external melting metal furnace, and the liquid metal transportation tubing are connected in a high-temperature resistant manner, and the main furnace body, the external melting metal furnace, and the liquid metal transportation tubing are vacuumed or filled with an inert gas.

4. The apparatus of claim 1, wherein the internal melting metal furnace is heated by a resistance heating rod, and the liquid metal transportation tubing is heated by a flexible heating band.

5. The apparatus of claim 1, wherein:
    a master alloy is placed in the induction melting coil;
    the master alloy is heated by an intermediate frequency induction heating power supply;
    a mold shell placed on the water-cooled copper plate crystallizer is capable of being lifted into the mold shell heating and insulation cavity in the vertical direction; and
    the mold shell heating and insulation cavity is heated by a graphite heater.

6. The apparatus of claim 5, wherein the mold shell heating and insulation cavity is divided into a first heating zone and a second heating zone, and the first heating zone and the second heating zone are capable of independently controlling temperature rise.

7. The apparatus of claim 1, wherein the liquid metal sprayer is annular, and the liquid metal sprayer is provided with spray holes.

8. The apparatus of claim 1, wherein:
    the seeding system comprises a support;
    both the water-cooled copper plate crystallizer and the liquid metal collector are fixed on the support;
    the water-cooled copper plate crystallizer and the liquid metal collector are capable of being lifted or lowered simultaneously through the seeding system;
    and both sides of the support are provided with a screw rod.

9. The apparatus of claim 1, wherein an annular baffle is arranged around the liquid metal collector.

10. The apparatus of claim 1, wherein the vacuum pump comprises a mechanical pump, a Roots pump, and a diffusion pump.

11. A method of directional solidification by LMSC, comprising:
providing an apparatus according to claim 1;
placing the master alloy in the induction melting coil;
placing the mold shell on the water-cooled copper plate crystallizer;
casting alloy liquid formed by the master alloy into the mold shell after a temperature and an atmosphere in the apparatus are satisfied;
enabling the mold shell to pass through the liquid metal sprayer slowly downward in the vertical direction through the seeding system;
transporting, by the submerged liquid metal pump, liquid metal into the liquid metal sprayer through the upper liquid metal transportation tubing when the mold shell is about to pass through the liquid metal sprayer; and
spraying, by the liquid metal sprayer, the liquid metal on an outer surface of the mold shell when the mold shell passes through the liquid metal sprayer, so as to enhance cooling of the mold shell, and obtain a large temperature gradient at a solidification interface.

12. A process for directional solidification by LMSC, comprising
S0: providing an apparatus according to claim 1;
S1: placing the master alloy in the induction melting coil, placing the mold shell on the water-cooled copper plate crystallizer, and lifting the water-cooled copper plate crystallizer and the liquid metal collector in the vertical direction through the seeding system, such that the mold shell is lifted into the mold shell heating and insulation cavity after passing through the liquid metal sprayer;
S2: vacuumizing the main furnace body, and backfilling the main furnace body with an inert atmosphere to a predetermined pressure, wherein the inert atmosphere is argon;
S3: heating the external melting metal furnace, the internal melting metal furnace, and the liquid metal transportation tubing to a predetermined temperature, such that the liquid metal for cooling is melted and reaches a predetermined temperature;
S4: smelting the master alloy, and heating the mold shell heating and insulation cavity to a predetermined temperature;
S5: stop heating the internal melting metal furnace, and vacuumizing the main furnace body to a predetermined degree of vacuum;
S6: casting the molten master alloy into the mold shell; and
S7: enabling the mold shell to pass through the liquid metal sprayer slowly downward in the vertical direction through the seeding system, and spraying, by the liquid metal sprayer, the liquid metal on an outer surface of the mold shell when the mold shell passes through the liquid metal sprayer, so as to cool the mold shell.

13. The process of claim 12, further comprising:
S8: enabling the liquid metal falling during spraying to fall and be collected into the liquid metal collector, and flow into the internal melting metal furnace through the liquid metal collector; and
S9: transporting the liquid metal in the internal melting metal furnace to the external melting metal furnace through the lower liquid metal transportation tubing.

14. The process of claim 12, wherein the liquid metal is a metal with a low melting point and a high boiling point, and the liquid metal is tin, aluminum, and alloys thereof.

15. The process of claim 12, wherein in S2, before being backfilled with the argon, the main furnace body has a degree of vacuum not greater than 1 Pa.

16. The process of 12, wherein in S3, the liquid metal for spraying has a temperature 50° C. to 200° C. higher than its melting point.

17. The process of claim 12, wherein in S4, the predetermined temperature of the mold shell heating and insulation cavity is not less than 1,500° C.

18. The process of claim 12, wherein in S5, the predetermined degree of vacuum is not greater than 10 Pa.

19. The process of claim 12, wherein in S7, a seeding speed is adjusted between 1.5 mm/min and 20 mm/min, and the seeding speed is a constant speed or a variable speed.

* * * * *